United States Patent
Walley et al.

(10) Patent No.: US 6,236,362 B1
(45) Date of Patent: May 22, 2001

(54) MITIGATION OF ANTENNA TEST RANGE IMPAIRMENTS CAUSED BY PRESENCE OF UNDESIRABLE EMITTERS

(75) Inventors: George M. Walley, San Jose, CA (US); William D. Killen; Michael P. Zeitfuss, both of Satellite Beach, FL (US)

(73) Assignee: Harris Corporation, Melbourne, FL (US)

(*) Notice: Subject to any disclaimer, the term of this patent is extended or adjusted under 35 U.S.C. 154(b) by 0 days.

(21) Appl. No.: 09/295,015

(22) Filed: Apr. 20, 1999

(51) Int. Cl.$^7$ ..................................................... G01S 7/40
(52) U.S. Cl. .......... 342/360; 342/165; 342/169; 342/170; 342/173; 342/174; 324/500; 324/501; 343/703; 375/130; 375/140
(58) Field of Search ........................... 343/701, 703, 343/894; 324/500, 501; 342/165–174, 351, 360, 13–20; 375/130–153

(56) References Cited

U.S. PATENT DOCUMENTS

| | | |
|---|---|---|
| 4,581,767 * | 4/1986 | Monsen ................................ 342/173 |
| 4,937,584 | 6/1990 | Gabriel et al. ....................... 342/378 |
| 5,170,411 | 12/1992 | Ishigaki . |
| 5,363,403 | 11/1994 | Schilling . |
| 5,371,505 | 12/1994 | Michaels .............................. 342/360 |
| 5,396,255 | 3/1995 | Durkota et al. ..................... 342/360 |
| 5,467,368 | 11/1995 | Takeuchi et al. . |
| 5,493,304 | 2/1996 | Lee et al. ............................. 342/360 |
| 5,534,871 | 7/1996 | Hidaka et al. ....................... 342/113 |
| 5,553,062 | 9/1996 | Schilling . |

\* cited by examiner

Primary Examiner—Bernarr E. Gregory
(74) Attorney, Agent, or Firm—Allen, Dyer, Doppelt, Milbrath & Gilchrist, P.A.

(57) ABSTRACT

An antenna test range uses direct spread-spectrum based test signals to test the performance of an antenna. Since a spread spectrum waveform has high autocorrelation properties with itself and high cross-correlation properties with signals other than itself, in the receiver coupled to the antenna it is possible to effectively electronically reject all unwanted signals that may be present in the test range, and thereby allow both main beam and off-axis performance of the antenna to be completely and accurately measured.

10 Claims, 2 Drawing Sheets

MITIGATION OF ANTENNA TEST RANGE IMPAIRMENTS CAUSED BY PRESENCE OF UNDESIRABLE EMITTERS

CROSS-REFERENCE TO RELATED APPLICATIONS

The present invention relates to subject matter disclosed in co-pending U.S. patent application Ser. No. 09/294,940 filed Apr. 20,1999, entitled: "Extension of Dynamic Range of Emitter and Detector Circuits of Spread Spectrum-Based Antenna Test Range," by M. Walley et al, assigned to the assignee of the present application, and the disclosure of which is incorporated herein.

FIELD OF THE INVENTION

The present invention relates in general to communication systems, and is particularly directed to a new and improved antenna range test mechanism that uses direct spread-spectrum based test signals to mitigate against impairments to an antenna test range caused by multipath and or the presence of one or more interfering emitters.

BACKGROUND OF THE INVENTION

The design and testing of a radio wave antenna has historically been principally concerned with the antenna's performance (especially gain) in the direction of its boresight or main beam axis. For this purpose, as diagrammatically illustrated in FIG. 1, an antenna 10 whose performance is to be measured may be mounted inside a compact test range 12, such as an EMI-shielded anechoic chamber, that is configured to eliminate reflections and interference from unwanted sources of electromagnetic radiation. Testing the antenna typically involves directing radio wave emissions from a test signal source 14 toward the antenna 10, and measuring the amplitude and phase response of the antenna by means of a range receiver 16, the output of which may be displayed or recorded via an associated test and measurement workstation 18. As the relative orthogonal principle planes (e.g., azimuth and elevation) parameters between the antenna 10 and test signal source 14 are varied (for example, by moving either the antenna or the test source), both boresight and off-axis gain parameters are derived.

Unfortunately, at relatively low frequencies, such as UHF, the size of such a test range becomes physically and cost-wise prohibitive, making it necessary to test the antenna design outdoors. While finding a location to set up an outdoor antenna test range that is free of interferers may not have been particularly difficult several decades ago, it has now become a significant problem due to the proliferation of wireless commercial products, such as cellular phones and citizen band radios, as well as specular reflections from buildings and the like.

Moreover, this interference and reflection free test range problem is compounded by the fact that antenna designers are no longer necessarily principally interested in boresight performance; they now must measure the antenna's off-axis characteristics, in order, for example, to evaluate its ability to place nulls on one or more of the continually growing number of interferers,.such as the cellular phone and CB radio devices, referenced above. Thus, the outdoor test range operator could face the dilemma of trying to measure side lobe characteristics of the antenna, without the presence of one or more likely interferers, while at the same time designing the antenna to exhibit a characteristic that allows placement of nulls on such interferers.

SUMMARY OF THE INVENTION

In accordance with the present invention the test range impairment problem described above is effectively mitigated by employing a test signal whose characteristics facilitate the signal processing or electronic rejection of all other signals that may be present in the test range, and thereby allows both main beam and sidelobe characteristics of the antenna to be accurately measured. For this purpose, the present invention uses a test signal, which has very high autocorrelation properties with itself on the one hand for test measurement purposes, and high cross-correlation properties with signals other than itself (especially including interferers and specular reflection) for interference rejection. A signal waveform that readily complies with this requirement is a direct sequence spread-spectrum signal.

Pursuant to a non-limiting, but preferred embodiment of the invention, just as in the test ranges of FIGS. 1 and 2, the antenna under test may be mounted at a location at which measurements are to be conducted by range receiver equipment connected to the antenna. To measure antenna gain and phase parameters for variations in orthogonal principle planes, the antenna's response may be measured as a test range signal source, that is operative to generate a direct spread-spectrum signal, is moved relative to the antenna's boresight axis. Conversely, the test source may be fixed and the antenna's pointing angle varied in orthogonal principle planes.

The test range receiver equipment, to which the output of the antenna under test is coupled, may comprise an RF receiver section which demodulates and bandpass filters the spread test signal received from the test signal source and outputs a signal that is despread in a correlation processor to recover the earliest line-of-sight emission from the test source. Multipath is circumvented by selecting the earliest in time (first-to-arrive) correlator output signal, which is time-aligned with the reference PN signal, whose energy content exceeds a prescribed threshold in order to identify the line-of-sight traveling test signal of interest.

Impairments due to RF emissions other than those sourced from the spread signal test signal source are avoided, since the energy in the correlator outputs for these other emissions is highly cross-correlated with the reference PN sequence, and therefore effectively null. The energy in the highly autocorrelated output of the correlator processor is digitized and processed by way of the antenna performance measurement algorithm executed by a test processor.

Another advantage of the invention is the converse of the above, i.e., the test range signal is highly crosscorrelated to licensed transmitters, and therefore interference of such signals is eliminated or reduced to a non-interfering level.

DETAILED DESCRIPTION

Figure 1:
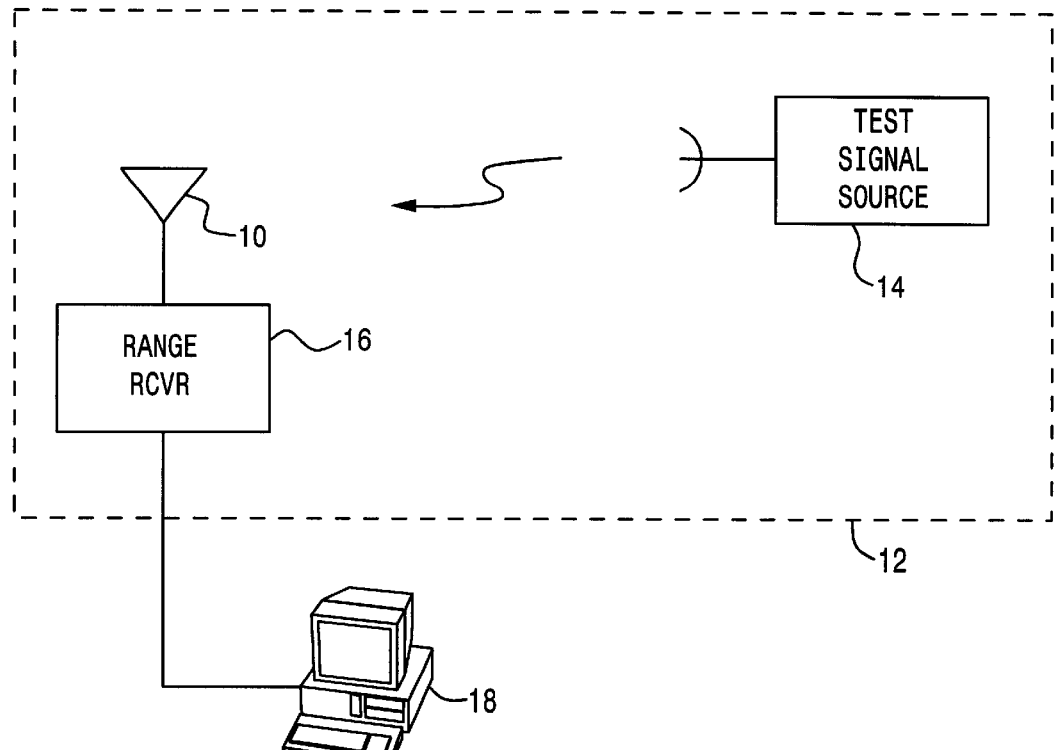
FIG. 1 diagrammatically illustrates a compact enclosed antenna test range.

Before describing in detail the new and improved antenna test range in accordance with the present invention, it should be observed that the invention resides primarily in a prescribed arrangement of conventional communication circuits and associated digital signal processing components and attendant supervisory control circuitry therefor, that controls the operations of such circuits and components so as to enable both the main beam and off-axis performance of an antenna under test to be accurately measured, irrespective of the presence of one or more interferers or specular reflectors.

Consequently, the configuration of such circuits components and the manner in which they are interfaced with other test range equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations are primarily intended to show the major components of the system in a convenient functional grouping, whereby the present invention may be more readily understood.

Figure 2:
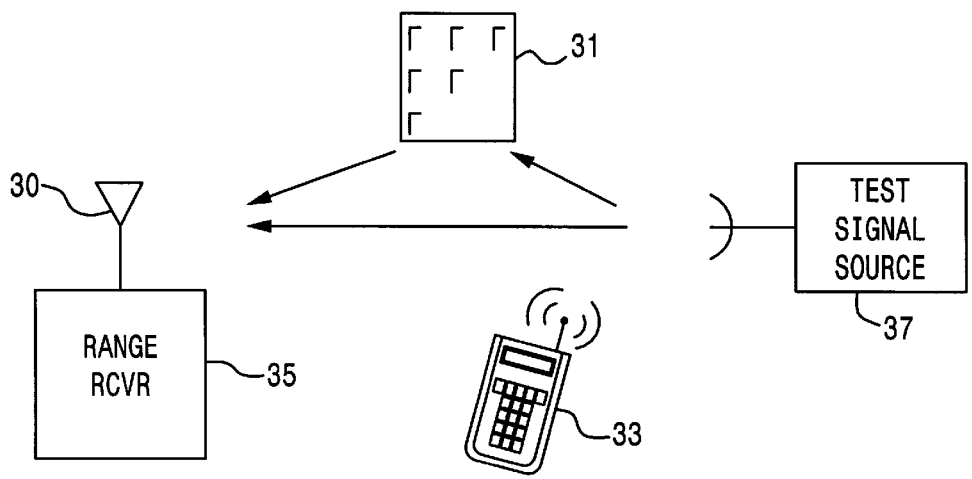
FIG. 2 diagrammatically illustrates an embodiment of an antenna test range in accordance with the present invention that is configured to mitigate against the presence of test range impairments.

FIG. 2 diagrammatically illustrates an embodiment of an antenna test range in accordance with the present invention that is configured to mitigate against the presence of test range impairments, such as but not limited to specular reflections from a building 31, or signals emitted from one or more 'interference' sources 33, such as a cellular radio, that may be incident upon an antenna 30 whose performance is to be measured.

As in a typical outdoor test range, the antenna 30 may be mounted at a prescribed location at which measurements are to be conducted by way of associated range receiver equipment 35 connected to the antenna 30. Radio wave emissions in the band over which the antenna is operated are directed from a test signal source 37 toward the antenna 30, and the response of the antenna 30 is measured by means of the range receiver equipment 35. To measure the antenna's gain and phase parameters for variations in orthogonal principle planes, the antenna's response may be measured, as the orientation in orthogonal principle planes of the antenna is changed or the test range signal source 37 may be moved relative to the antenna's boresight axis.

As described briefly above, the incidence on the antenna 30 of potentially impairing emissions or reflections, such reflections 32 from a building 31 and/or emissions from 'interference' sources such as a cellular radio 33, are mitigated in accordance with the invention by using a direct spread-spectrum signal as the test signal source waveform. A principal advantage of using a spread-spectrum test signal is the fact that its signature is unique, having high autocorrelation properties with itself, and high cross-correlation properties with signals other than itself.

Figure 3:
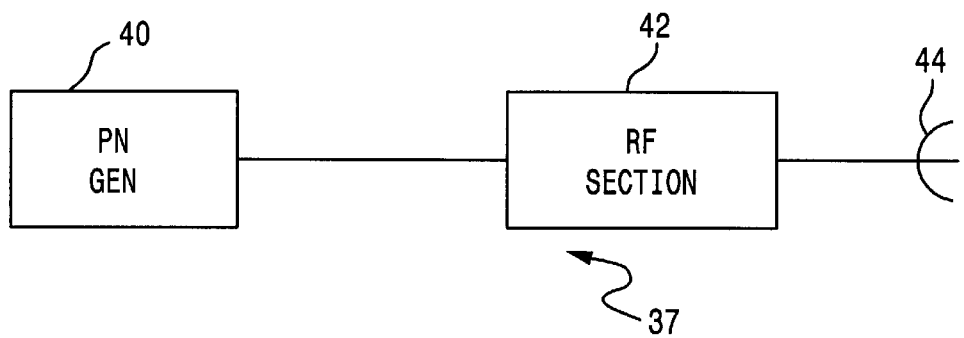
FIG. 3 diagrammatically illustrates a direct spread-spectrum signal based test signal source for use in the antenna test range of FIG. 2.

For this purpose, the test signal source 37 of the test range of FIG. 2 may be configured as diagrammatically illustrated in FIG. 3, which shows a direct spreading pseudo-random chip sequence generator 40, the output of which is a 'spread' or 'chipped' data stream having a prescribed number of chips per baud. The chip sequence produced by generator 40 is coupled to the test source's RF section 42, which may comprise an RF mixer to which an RF carrier and the spreading PN sequence output by PN spreading sequence generator 40 are applied, as a non-limiting example. The resulting spread RF test carrier produced by the RF section 42 is then transmitted via a test source antenna 44 along a prescribed transmission axis toward the antenna under test.

Figure 4:
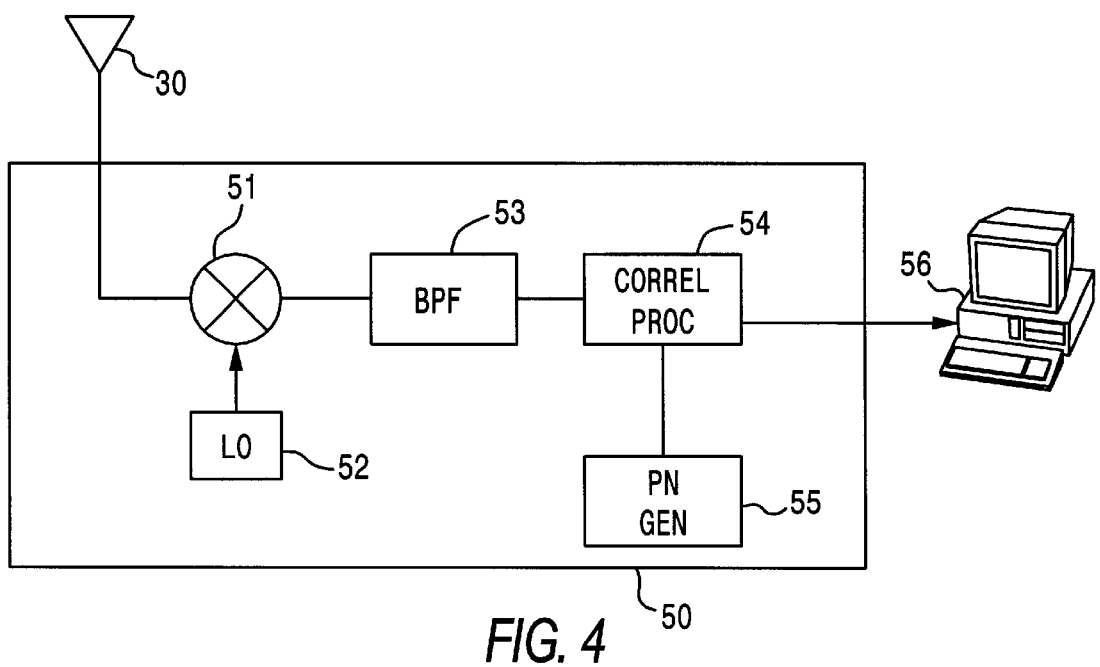
FIG. 4 diagrammatically illustrates the configuration of range receiver equipment for the antenna test range of FIG. 2.

A non-limiting example of range receiver equipment, to which the output of the antenna under test is coupled, is shown diagrammatically in FIG. 4, as comprising an RF receiver-despreader section 50, which receives the spread test signal emitted by the test signal source 37 and despread-correlation processes the received signal to recover the earliest line-of-sight emission from the test source. For this purpose, the receiver section 50 may include a mixer 51 to which the output of a local oscillator 52 is applied, to provide a baseband spread signal that is coupled through a bandpass filter 53 to a correlation processor 54. The correlation processor 54 is coupled to receive a spread-spectrum reference signal pattern produced by a pseudo random noise (PN) generator 55. The PN generator 55 is operative to generate the same direct spreading PN sequence employed by the test signal source of FIG. 3, described above.

Impairments due to multipath are readily avoided by selecting the earliest-in-time correlator output signal whose energy content exceeds a prescribed (adaptive) threshold to identify the first-to-arrive (line-of-sight) test signal of interest. Impairments due to RF emissions other than those sourced from the test signal source are avoided, since the energy in the correlator output for other emissions is highly cross-correlated (rather than highly auto-correlated) with the reference PN sequence, and therefore effectively null. The energy in the highly autocorrelated (first-to-arrive) output of the correlation processor 54 is then digitized and processed by way of the antenna performance measurement algorithm executed by a work station 56 associated with the range receiver equipment.

As will be appreciated from the foregoing description, by employing a test signal, such as a spread spectrum waveform having high autocorrelation properties with itself and high cross-correlation properties with signals other than itself to test the characteristics of an antenna, the test range methodology of the present invention makes it possible to electronically reject all unwanted signals that may be present in the test range, and thereby allows both main beam and off-axis performance of the antenna to be completely and accurately measured.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed is:

1. A method of testing an antenna comprising the steps of:
   (a) radiating a test signal from a test signal source from a plurality of spaced apart signal source directions relative to a boresight of said antenna, and having respectively different orthogonal principle plane parameters relative to said boresight of said antenna, so that said test signal is incident upon said antenna from a plurality of different directions relative to the boresight axis of said antenna;
   (b) for each of the plurality of spaced apart signal source locations employed in step (a), receiving and demodulating signals received by said antenna;
   (c) correlating a replica of said test signal with signals received and demodulated in step (b), so as to extract energy in said test signal and exclude energy in any other signals that may be incident upon said antenna; and
   (d) processing test signal energy extracted in step (c) to derive a measure of said one or more characteristics of said antenna.

2. A method according to claim 1, wherein said test signal comprises a spread spectrum signal.

3. A method according to claim 1, wherein step (d) includes processing test signal energy extracted in step (c) to recover earliest line-of-sight test signals radiated from said test signal source in step (a), and step (d) comprises processing said earliest line-of-sight test signals to derive said measure of said one or more characteristics of said antenna.

4. A method according to claim 1, wherein step (a) comprises radiating said test signal from said test signal source placed at a plurality of spaced apart signal source locations relative to said boresight of said antenna.

5. A method according to claim 1, wherein step (a) comprises radiating said test signal from said test signal source placed at a given location and changing the orientation of said antenna so as to cause said test signal radiated from said test signal source to be incident upon said antenna from a plurality of different directions relative to said boresight of said antenna.

6. An antenna test range comprising:
- a test signal source, spaced apart from an antenna under test and being operative to emit a test signal from a plurality of spaced apart signal source directions relative to a boresight of said antenna, and having respectively different orthogonal principle plane parameters relative to said boresight of said antenna, so that said test signal is incident upon said antenna from a plurality of different directions relative to the boresight axis of said antenna;
- a receiver coupled to said antenna under test, and being operative to demodulate a signal received by said antenna under test, and to correlate a replica of said test signal with the demodulated signal so as to extract energy in said test signal and exclude energy in any other signals that may be incident upon said antenna under test; and
- a signal processor, coupled to said receiver, operative to process the test signal energy extracted by said receiver and derive a measure of one or more characteristics of said antenna under test.

7. An antenna test range according to claim 6, wherein said test signal comprises a spread spectrum signal.

8. An antenna test range according to claim 6, wherein said signal processor is operative to process test signal energy extracted by said receiver to recover earliest line-of-sight test signals radiated from said test signal source, and to process said earliest line-of-sight test signals to derive said measure of said one or more characteristics of said antenna.

9. An antenna test range according to claim 6, wherein said test signal source is operative to radiate said test signal from a plurality of spaced apart signal source locations relative to said boresight of said antenna.

10. An antenna test range according to claim 6, wherein said test signal source is operative to radiate said test signal from a given location and, wherein the orientation of said antenna is changed so as to cause said test signal radiated from said test signal source to be incident upon said antenna from a plurality of different directions relative to said boresight of said antenna.

* * * * *

UNITED STATES PATENT AND TRADEMARK OFFICE
CERTIFICATE OF CORRECTION

PATENT NO.      : 6,236,362 B1                                                         Page 1 of 1
DATED           : May 22, 2001
INVENTOR(S)     : George M. Walley, William D. Killen, and Michael P. Zeitfuss It is certified that error appears in the above-identified patent and that said Letters Patent is hereby corrected as shown below:

<u>Title page,</u>
Item [75], Inventors, delete:
William D. Killen; Michael P. Zeitfuss, both Satellite Beach, FL", insert
-- William D. Killen, Palm Bay, FL (US); and Michael P. Zeitfuss, Satellite Beach, FL (US) --

<u>Column 1,</u>
Line 9, delete "09,294,940" insert -- 09/294,940 --

Signed and Sealed this

Fourth Day of June, 2002

*Attest:*

JAMES E. ROGAN
*Attesting Officer*           *Director of the United States Patent and Trademark Office*